US006095278A

United States Patent [19]

Lin

[11] Patent Number: 6,095,278

[45] Date of Patent: Aug. 1, 2000

[54] BASE FOR HOLDING THE TWEETER OF A SPEAKER

[76] Inventor: Steff Lin, 8F., No. 18, Lane 30, Kuo Hsing St., Hsi Chih Chen, Taipei Hsien, Taiwan

[21] Appl. No.: 09/300,602

[22] Filed: Apr. 28, 1999

[51] Int. Cl.$^7$ ........ H05K 5/00

[52] U.S. Cl. ........ 181/148; 181/153; 181/161; 181/199; 181/165; 381/182; 381/184; 381/185; 381/186

[58] Field of Search ........ 181/148, 153, 181/161, 199, 144, 155, 163, 164, 165; 381/182, 184, 185, 186, 192, 90, 160

[56] References Cited

U.S. PATENT DOCUMENTS

| | | | |
|---|---|---|---|
| 249,103 | 11/1881 | Schafer . | |
| 4,552,242 | 11/1985 | Kashiwabara | 181/144 |
| 4,965,837 | 10/1990 | Murayama et al. | 381/186 |
| 5,568,562 | 10/1996 | Huang | 381/186 |
| 5,629,501 | 5/1997 | Fenton | 181/144 |
| 5,739,480 | 4/1998 | Lin . | |
| 6,002,780 | 12/1999 | Espiritu | 381/182 |

*Primary Examiner*—Bentsu Ro
*Assistant Examiner*—Edgardo San Martin
*Attorney, Agent, or Firm*—Bacon & Thomas, PLLC

[57] ABSTRACT

A speaker base, which includes a tweeter holder having a holder base and a bottom mounting holder rod, and withholding ring mounted on the tweeter holder to hold a tweeter, wherein the tweeter holder has an axial center through hole through its holder base and bottom mounting holder rod through which the lead wires of the tweeter pass.

1 Claim, 5 Drawing Sheets

BASE FOR HOLDING THE TWEETER OF A SPEAKER

BACKGROUND OF THE INVENTION

The present invention provides an improvement on U.S. Pat. No. 5,739,480, entitled "the speaker base adapted for use with a tweeter and a diffuser for woofer alternatively". The improvement provides an axial through hole at the center of the tweeter holder for receiving the lead wires of the tweeter or diffuser for woofer, and means for enabling the tweeter or diffuser for woofer to be rotated with the withholding ring to the desired direction.

According to U.S. Pat. No. 5,739,480, and shown in FIG. 1 of the drawings herein the tweeter holder 2 comprises a holder base 202 supported on a bottom plate, and a bottom mounting holder rod 201 plugged into a center through hole 1051 at the bottom plate and then fixedly secured to a cover shell 106 by a screw bolt 13. The holder base 202 is shaped like a cup, having a plurality of lugs 2021 around its periphery, and a terminal 107A connected in parallel with terminal 107 by a conductor wire. Further, the tweeter 4 has a withholding ring 5 formed integral with its periphery. The withholding ring 5 comprises a skit 501 having a groove 502 around its inside wall and a plurality of downward guide grooves 503 respectively and perpendicularly extended from the groove 501 to the bottom edge thereof. When the tweeter 4 is inserted into the inside of the holder base 202 of the tweeter holder 2 to compress a spring 3, the lugs 2021 are respectively forced through the grooves 503 into the groove 502, then turned clockwise in a certain angle to separate the lugs 2021 and the groove 503, and therefore the tweeter 4 is maintained stable at the holder base 202. On the contrary, when dismounting the tweeter 4, the tweeter 4 is pressed down to compress the spring 3, then the tweeter holder 2 is rotated counter-clockwise to align the groove 502 with the lugs 2021, and therefore the tweeter 4 is allowed to be removed from the tweeter holder 2.

SUMMARY OF THE INVENTION

According to a first embodiment, the tweeter holder has an axial center through hole through its holder base and bottom mounting holder rod through which the lead wires of the tweeter or diffuser for woofer pass. According to a second embodiment of the present invention, a bearing holder is mounted on the tweeter holder to hold a withholding ring and a tweeter or diffuser for woofer on the withholding ring, wherein the withholding ring comprises a coupling groove around the periphery thereof; the bearing holder comprises an upright tube, the upright tube having a top flange forming a shoulder and clamping on the coupling groove at the withholding ring for enabling the withholding ring to be rotated on the upright tube to the desired direction.

DETAILED DESCRIPTION OF THE PREFERRED EMBODIMENT

Figure 1:
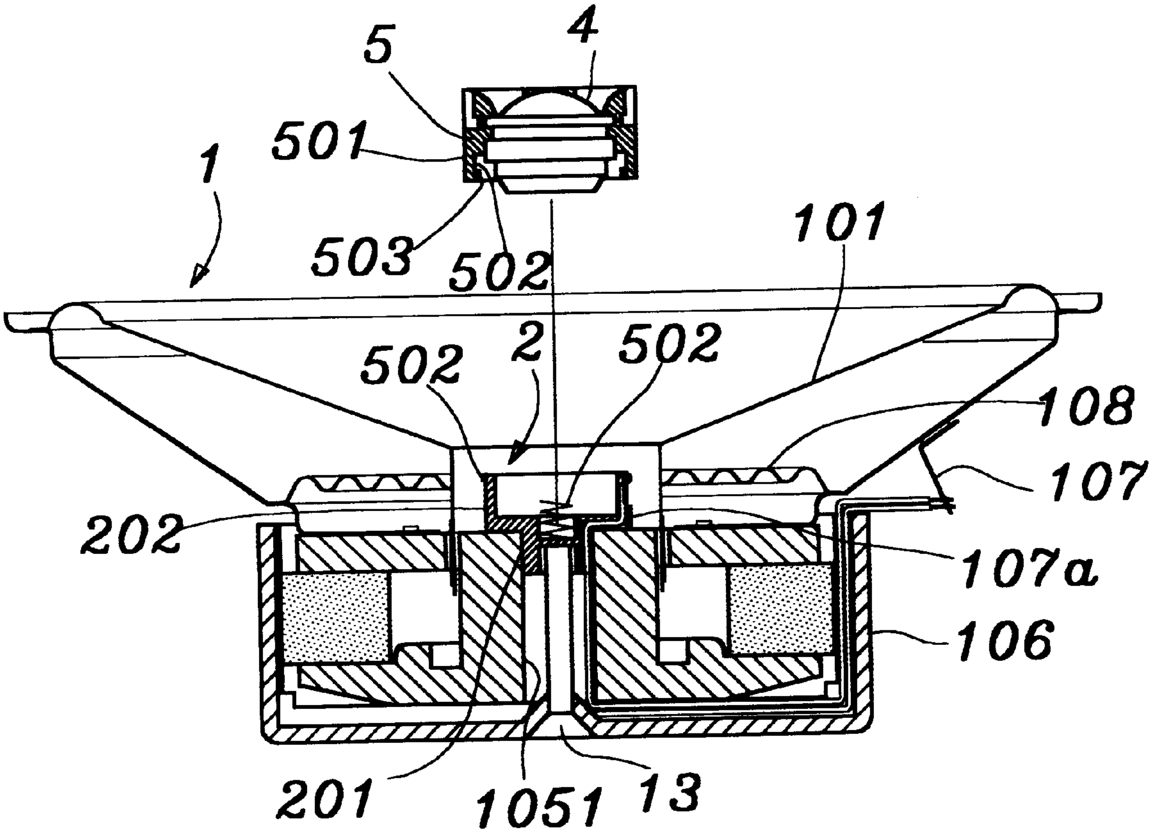
PRIOR ART FIG. 1
FIG. 1 is a sectional view of a speaker base and a tweeter according to U.S. Pat. No. 5,739,480.
Figure 2:
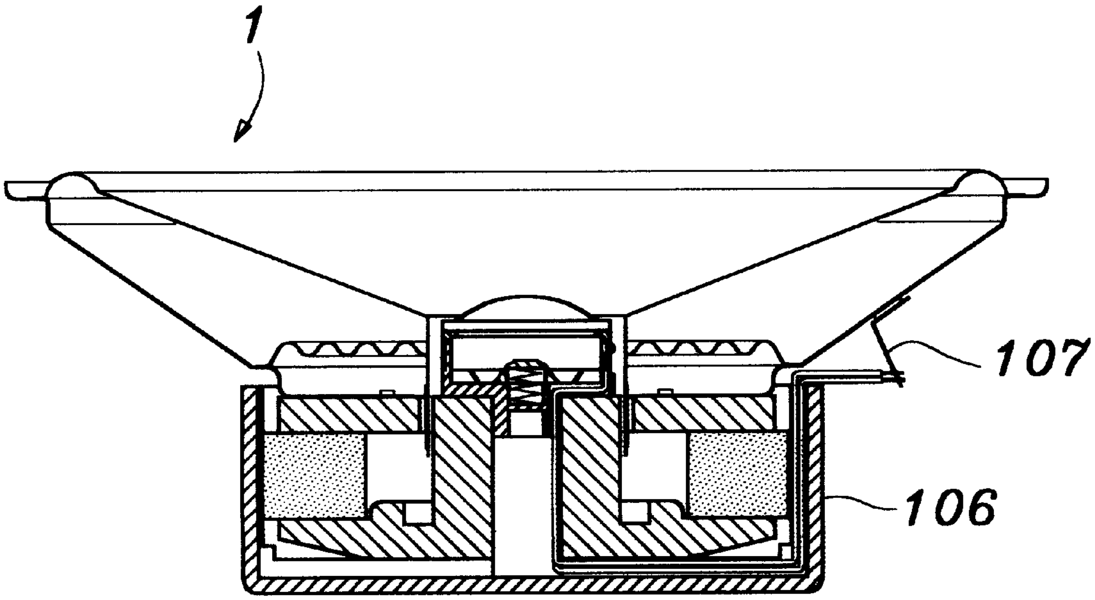
PRIOR ART FIG. 2
FIG. 2 is a sectional front view of the assembly of the speaker base and the tweeter shown in FIG. 1.
Figure 3:
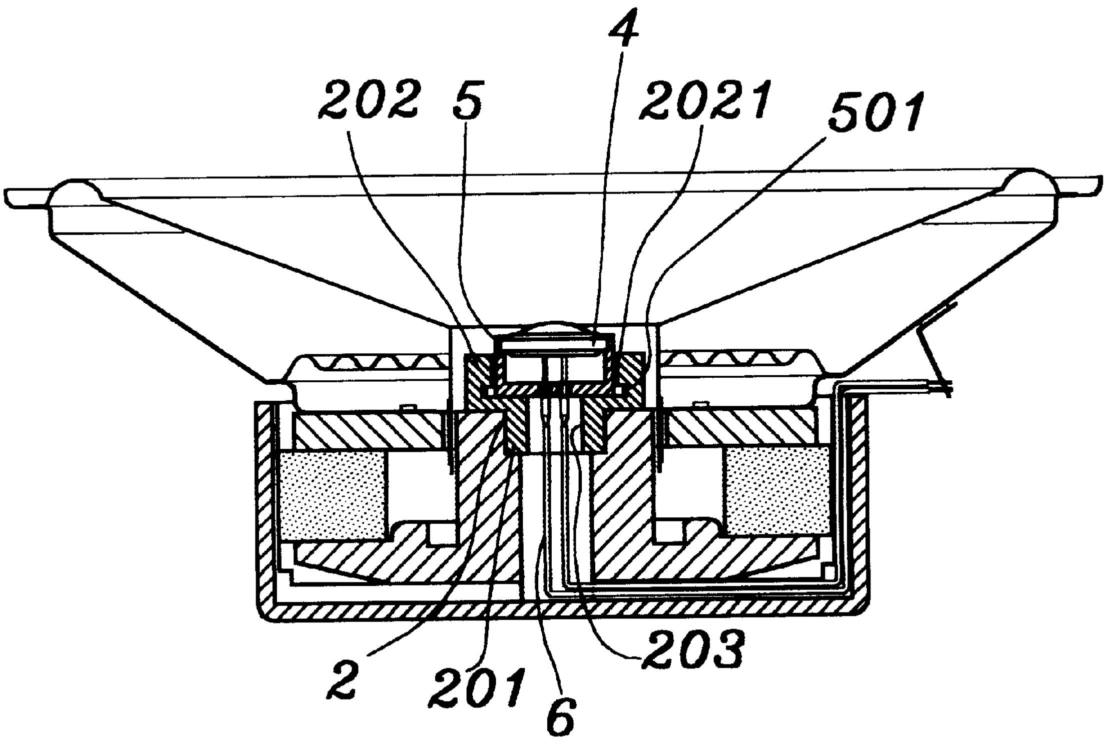
FIG. 3 is a sectional front view of a first embodiment of the present invention.

Referring to FIG. 3, the withholding ring 5 has peripheral lugs 501 detachably coupled to respective L-shaped grooves 2021 inside the holder base 202 of the tweeter holder 2 through a rotary motion. The tweeter holder 2 comprises an axial through hole 203 through the holder base 202 and the bottom mounting holder rod 201. The axial through hole 203 receives the lead wires 6 of the tweeter 4. Therefore, the lead wires 6 of the tweeter 4 are concealed from sight.

Figure 4:
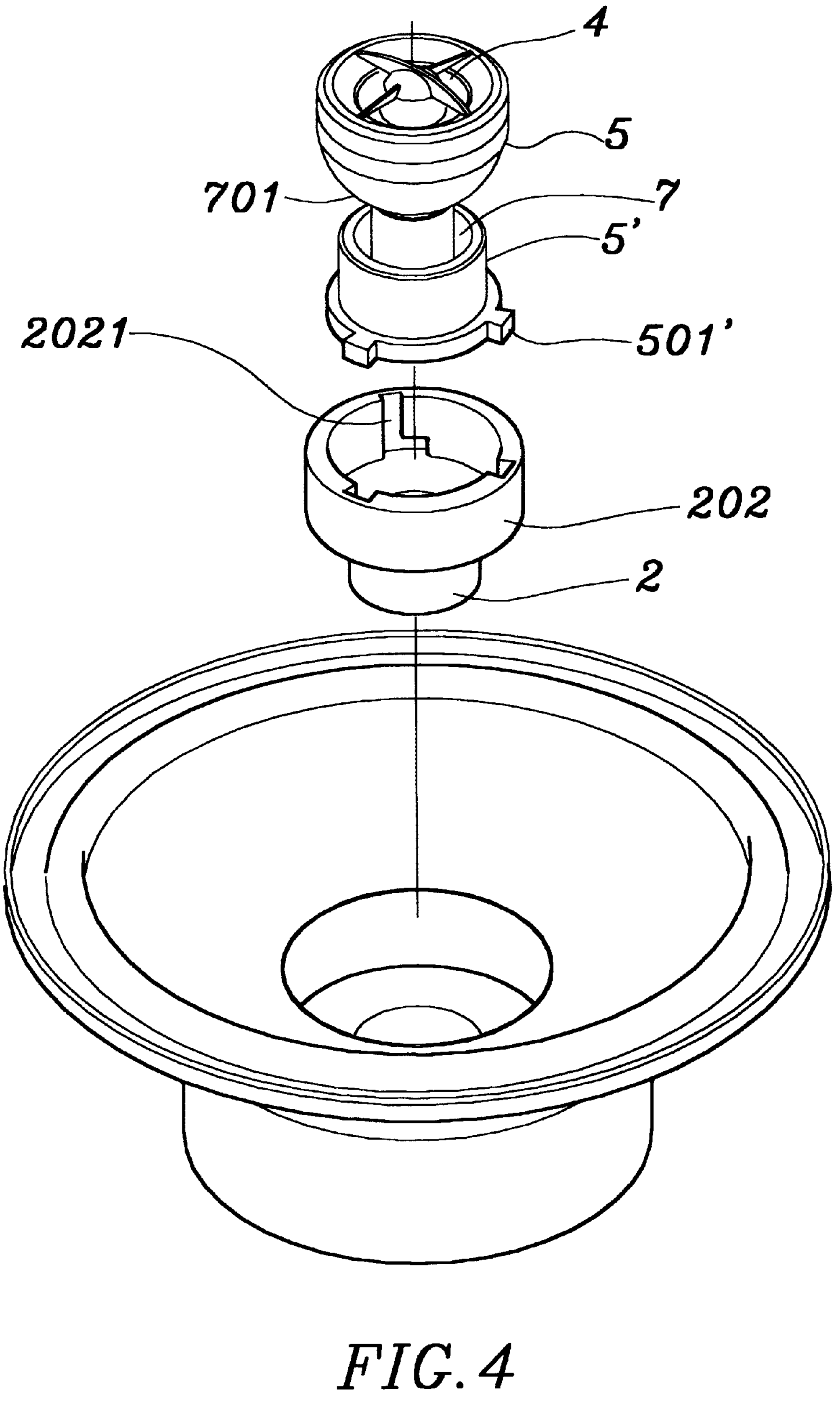
FIG. 4 is an exploded view of a second embodiment of the present invention.
Figure 5:
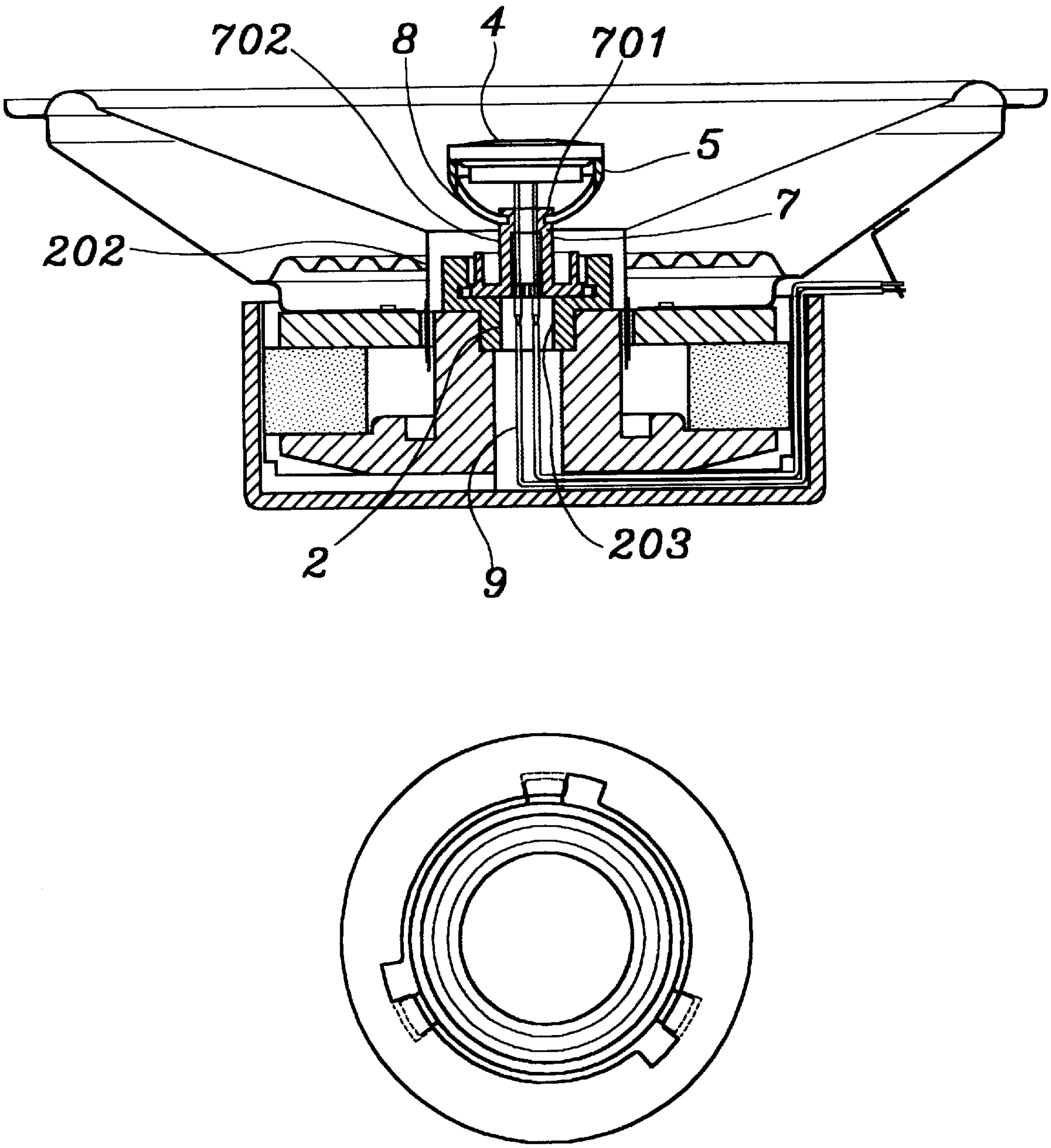
FIG. 5 is a sectional front view of the assembly shown in FIG. 4.

FIGS. 4 and 5 show a second embodiment of the present invention. According to this embodiment, the tweeter holder 2 is remain unchanged. A bearing holder 5' comprises peripheral lugs 501', which are detachably coupled to respective L-shaped grooves 2021 inside the holder base 202 of the tweeter holder 2 upon a rotary motion of the bearing holder 5', and an upright tube 7 at the center. The upright tube 7 has a top flange 701 forming a shoulder 702 for clamping on a coupling groove 8 around the withholding ring 5, which holds the tweeter 4. After installation of the withholding ring 5 in the upright tube 7, the tweeter 4 can be rotated with the withholding ring 5 on the shoulder 702 to the desired direction, and the lead wires 9 of the tweeter 4 are extended out of the tweeter holder 2 through the upright tube 7 and the axial through hole 203 at the center of the tweeter holder 2.

It is to be understood that the drawings are designed for purposes of illustration only, and are not intended as a definition of the limits and scope of the invention disclosed.

What the invention claimed is:

1. A speaker base comprising a tweeter holder having a holder base and a bottom mounting holder rod, a bearing holder mounted on the holder base of said tweeter holder, a withholding ring mounted on said bearing holder to hold a tweeter, said bearing holder including a plurality of peripheral lugs adjacent a bottom side thereof and detachably coupled to a plurality of respective L-shaped grooves inside the holder base of said tweeter holder through a rotary motion, wherein said withholding ring further including a coupling groove around the periphery thereof, said bearing holder further including an upright tube at a center in axial alignment with said axial through hole for the passing of the lead wires of said tweeter therethrough, said upright tube having a top flange forming a shoulder clamping on the coupling groove at said withholding ring for enabling said withholding ring to be rotated on said upright tube in a desired direction.

* * * * *